(12) United States Patent
Happ et al.

(10) Patent No.: US 7,973,301 B2
(45) Date of Patent: *Jul. 5, 2011

(54) LOW POWER PHASE CHANGE MEMORY CELL WITH LARGE READ SIGNAL

(75) Inventors: Thomas Happ, Pleasantville, NY (US); Shoaib Hasan Zaidi, Poughkeepsie, NY (US); Jan Boris Philipp, Peekskill, NY (US)

(73) Assignee: Qimonda AG, Munich (DE)

( * ) Notice: Subject to any disclaimer, the term of this patent is extended or adjusted under 35 U.S.C. 154(b) by 495 days.

This patent is subject to a terminal disclaimer.

(21) Appl. No.: 11/133,491

(22) Filed: May 20, 2005

(65) Prior Publication Data

US 2006/0261321 A1 Nov. 23, 2006

(51) Int. Cl.
*H01L 47/00* (2006.01)
*H01L 29/02* (2006.01)
*H01L 29/04* (2006.01)
*H01L 29/06* (2006.01)

(52) U.S. Cl. . 257/2; 257/4; 257/E47.001; 257/E29.003; 257/E29.005

(58) Field of Classification Search .................. 257/200, 257/1–5, E47.001, E29.002, E29.003, E29.005, 257/E29.006

See application file for complete search history.

(56) References Cited

U.S. PATENT DOCUMENTS

| | | | | |
|---|---|---|---|---|
| 6,765,823 B1* | 7/2004 | Zhu et al. | | 365/173 |
| 6,992,369 B2* | 1/2006 | Kostylev et al. | | 257/537 |
| 7,262,502 B2* | 8/2007 | Chang | | 257/758 |
| 7,615,770 B2* | 11/2009 | Philipp et al. | | 257/2 |
| 2003/0052351 A1 | 3/2003 | Xu et al. | | |
| 2003/0067013 A1* | 4/2003 | Ichihara et al. | | 257/200 |
| 2003/0209728 A1* | 11/2003 | Kozicki et al. | | 257/200 |
| 2003/0224292 A1* | 12/2003 | Shingai et al. | | 430/270.12 |
| 2004/0051161 A1 | 3/2004 | Tanaka et al. | | |
| 2004/0109351 A1 | 6/2004 | Morimoto et al. | | |
| 2004/0125676 A1* | 7/2004 | Osada et al. | | 365/201 |
| 2004/0178404 A1* | 9/2004 | Ovshinsky | | 257/4 |
| 2006/0226409 A1* | 10/2006 | Burr et al. | | 257/2 |

FOREIGN PATENT DOCUMENTS

| | | |
|---|---|---|
| WO | 93/02480 | 2/1993 |
| WO | 98/36446 | 8/1998 |

OTHER PUBLICATIONS

S. Lai, T. Lowrey, OUM-a 180 nm nonvolatile memory cell element technology for stand alone and embedded applications, IEDM 2001 (6 pgs.).

H.Horii et al., "A novel cell technology using N-doped GeSbTe films for phase change RAM", VLSI, 2003 (2 pgs.).

(Continued)

*Primary Examiner* — Anh Phung
*Assistant Examiner* — Allison P Bernstein
(74) *Attorney, Agent, or Firm* — Dicke, Billig & Czaja, PLLC

(57) ABSTRACT

A memory cell includes a first electrode, a second electrode, and phase-change material including a first portion contacting the first electrode, a second portion contacting the second electrode, and a third portion between the first portion and the second portion. A width of the third portion is less than a width of the first portion and a width of the second portion.

23 Claims, 10 Drawing Sheets

OTHER PUBLICATIONS

Y.N. Hwang et al., "Full integration and reliability evaluation of phase-change RAM based on 0.24μm-CMOS technologies", VLSI, 2003 (pp. 173-174).

Y.H Ha et al., "An edge contact type cell for phase change RAM reaturing very low power consumption", VLSI, 2003 (2 pgs.).

S. Lai, "Current Status of the Phase Change Memory and its Future". IEDM 2003.

J.H. Yi et al., "Novel Cell Structure of PRAM with Thin Metal Layer Inserted GeSbTe", IEDM 2003.

European Search Report mailed Jul. 3, 2007.

* cited by examiner

LOW POWER PHASE CHANGE MEMORY CELL WITH LARGE READ SIGNAL

BACKGROUND

Phase-change memories include phase-change materials that exhibit at least two different states. Phase-change material may be used in memory cells to store bits of data. The states of phase-change material may be referenced to as amorphous and crystalline states. The states may be distinguished because the amorphous state generally exhibits higher resistivity than does the crystalline state. Generally, the amorphous state involves a more disordered atomic structure, while the crystalline state is an ordered lattice. Some phase-change materials exhibit two crystalline states, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase-change materials may be induced reversibly. In this way, the memory may change from the amorphous state to the crystalline state, and from the crystalline state to the amorphous state, in response to temperature changes. The temperature changes to the phase-change material may be achieved in a variety of ways. For example, a laser can be directed to the phase-change material, current may be driven through the phase-change material, or current or voltage can be fed through a resistive heater adjacent the phase-change material. With any of these methods, controllable heating of the phase-change material causes controllable phase change within the phase-change material.

When a phase-change memory comprises a memory array having a plurality of memory cells that are made of phase-change material, the memory may be programmed to store data utilizing the memory states of the phase-change material. One way to read and write data in such a phase-change memory device is to control a current and/or a voltage pulse that is applied to the phase-change material. The level of current and voltage generally corresponds to the temperature induced within the phase-change material in each memory cell. To minimize the amount of power that is used in each memory cell, the cross-section of the current path through the phase-change material should be minimized.

SUMMARY

One embodiment of the present invention provides a memory cell. The memory cell includes a first electrode, a second electrode, and phase-change material including a first portion contacting the first electrode, a second portion contacting the second electrode, and a third portion between the first portion and the second portion. A width of the third portion is less than a width of the first portion and a width of the second portion.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
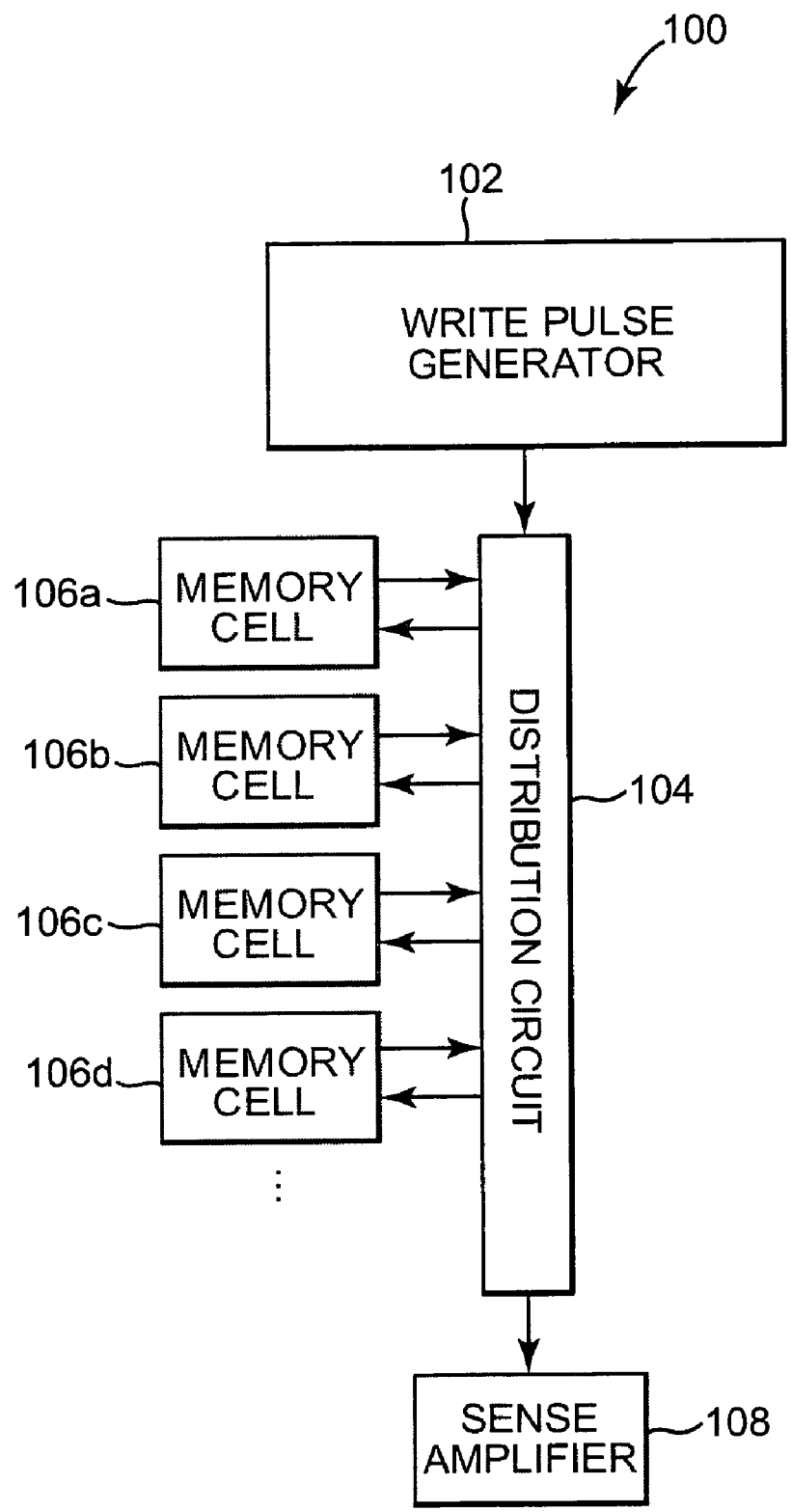
FIG. 1 is a block diagram illustrating one embodiment of a memory cell device.

FIG. 1 illustrates a block diagram of one embodiment of a memory cell device 100. Memory cell device 100 includes a write pulse generator 102, a distribution circuit 104, memory cells 106a, 106b, 106c, and 106d, and a sense amplifier 108. In one embodiment, memory cells 106a-106d are phase-change memory cells that are based on the amorphous to crystalline phase transition of the memory material.

Each phase-change memory cell 106a-106d includes phase-change material defining a storage location. The storage location includes a first portion contacting a first electrode, a second portion opposite the first portion and contacting a second electrode, and a third portion between the first portion and the second portion. The third portion has a width or cross-sectional area less than a width or cross-sectional area of the first portion and a width or cross-sectional area of the second portion. In one embodiment, the phase-change material defines an "I" shape, an hourglass shape, or other suitable shape in which the first portion and the second portion of the phase-change material have a width or cross-sectional area greater than a width or cross-sectional area of the third portion of the phase-change material. The shape of the phase-change material is configured to prevent low resistance shunt current paths at the perimeter of the phase-change memory cell through the phase-change material with the phase-change material not fully reset. In one embodiment, the first portion and the second portion of the phase-change material have dimensions defined by lithographic processes, and the third portion of the phase-change material has dimensions defined by a sublithographic process to provide a sublithographic width or cross-sectional area.

In one embodiment, write pulse generator 102 generates current or voltage pulses that are controllably directed to memory cells 106a-106d via distribution circuit 104. In one embodiment, distribution circuit 104 includes a plurality of transistors that controllably direct current or voltage pulses to the memory. In another embodiment, distribution circuit 104 includes a plurality of transistors that controllably direct current or voltage pulses to heaters adjacent to the phase-change memory cells.

In one embodiment, memory cells 106a-106d are made of a phase-change material that may be changed from an amorphous state to a crystalline state or from a crystalline state to an amorphous state under influence of temperature change. The degree of crystallinity thereby defines at least two memory states for storing data within memory cell device 100. The at least two memory states can be assigned to the bit values "0" and "1". The bit states of memory cells 106a-106d differ significantly in their electrical resistivity. In the amorphous state, a phase-change material exhibits significantly higher resistivity than in the crystalline state. In this way, sense amplifier 108 reads the cell resistance such that the bit value assigned to a particular memory cell 106a-106d is determined.

To program a memory cell 106a-106d within memory cell device 100, write pulse generator 102 generates a current or voltage pulse for heating the phase-change material in the target memory cell. In one embodiment, write pulse generator 102 generates an appropriate current or voltage pulse, which is fed into distribution circuit 104 and distributed to the appropriate target memory cell 106a-106d. The current or voltage pulse amplitude and duration is controlled depending on whether the memory cell is being set or reset. Generally, a "set" operation of a memory cell is heating the phase-change material of the target memory cell above its crystallization temperature (but below its melting temperature) long enough to achieve the crystalline state. Generally, a "reset" operation of a memory cell is heating the phase-change material of the target memory cell above its melting temperature, and then quickly quench cooling the material, thereby achieving the amorphous state.

Figure 2:
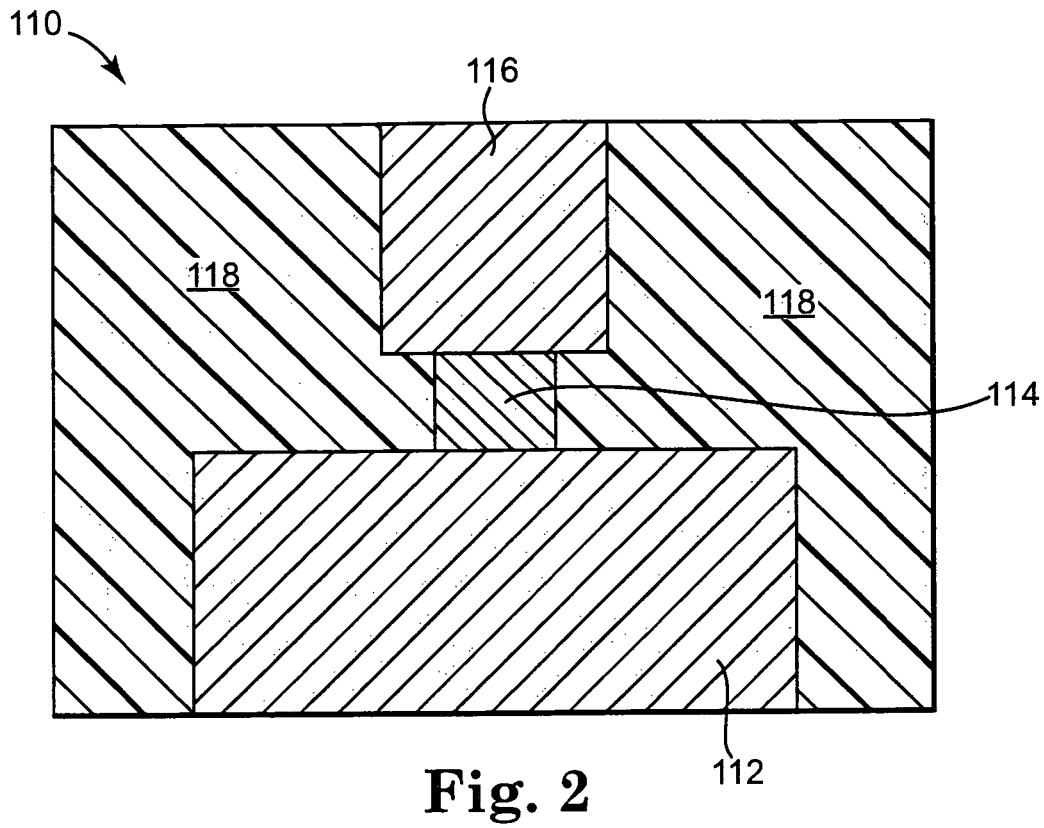
FIG. 2 illustrates a cross-sectional view of one embodiment of a phase-change memory cell.

FIG. 2 illustrates a cross-sectional view of one embodiment of a phase-change memory cell 110 of the active-in-via type. Phase-change memory cell 110 includes a first electrode 112, phase-change material 114, second electrode 116, and insulator material 118. Phase-change material 114 is laterally completely enclosed by insulation material 118, which defines the current path and hence the location of the phase-change region in phase-change material 114. Phase-change material 114 provides a storage location for storing one bit or several bits of data. A selection device, such as an active device like a transistor or diode, is coupled to first electrode 112 to control the application of current or voltage to first electrode 112, and thus to phase-change material 114, to set and reset phase-change material 114.

During a set operation of phase-change memory cell 110, a set current or voltage pulse is selectively enabled to phase-change material 114 thereby heating it above its crystallization temperature (but usually below its melting temperature). In this way, phase-change material 114 reaches its crystalline state during this set operation. During a reset operation of phase-change memory cell 110, a reset current and/or voltage pulse is selectively enabled by the selection device and sent through first electrode 112 to phase-change material 114. The reset current or voltage quickly heats phase-change material 114 above its melting temperature, and then phase-change material 114 is quickly quench cooled to achieve its amorphous state.

Figure 3:
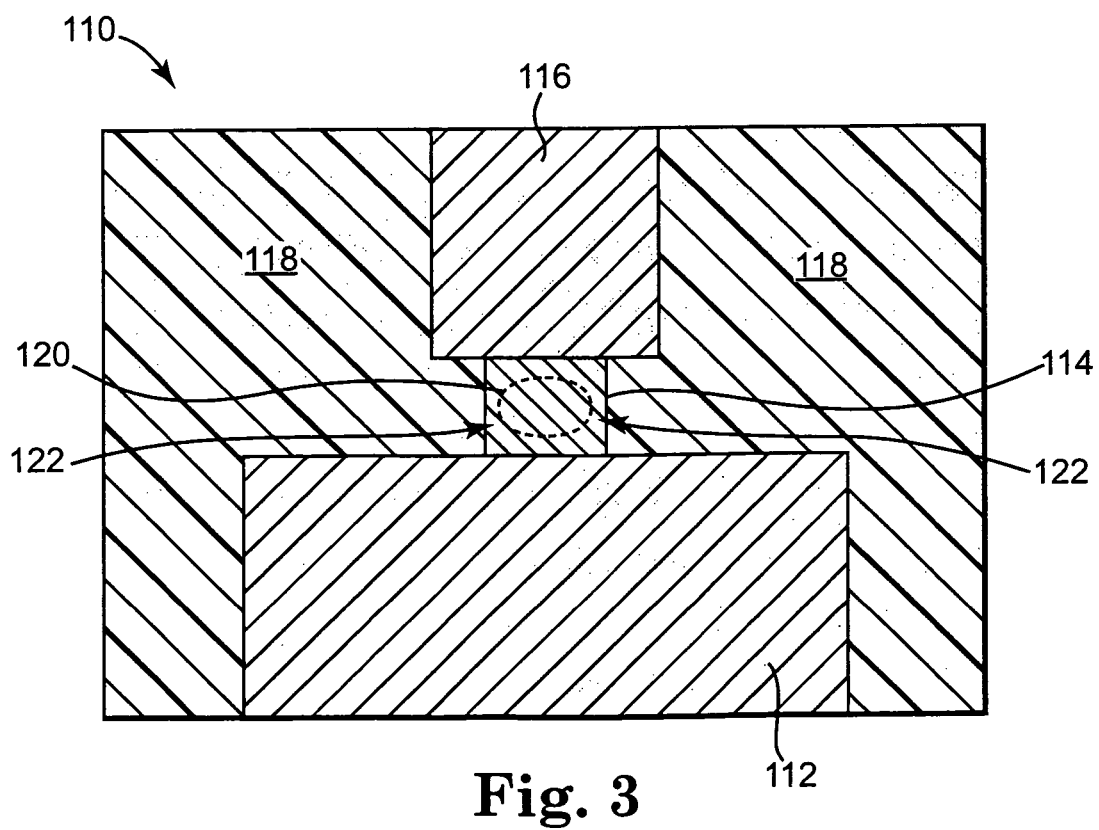
FIG. 3 illustrates a cross-sectional view of one embodiment of a phase-change memory cell with an illustrated temperature contour plot during a reset operation.

During a reset operation, phase-change material 114 typically begins heating and changing phases (melting) from the center of the cell due to thermal self-isolation of the phase-change material 114. Generated heat, however, may also diffuse into insulator material 118, which is typically a dielectric material like silicon dioxide. Thus, in a low power reset operation, which avoids excessive overheating of the center, there is a crystalline, ring-shaped volume at the edge of phase-change material 114 remaining in the crystalline state due to incomplete melting. Such an incompletely melted area 122 is illustrated in FIG. 3, surrounding a sufficiently melted area 120 in phase-change material 114. A read operation undertaken subsequent to a reset in such a configuration faces low resistance shunt current paths in the area 122. This will mask the readout signal detected by sense amplifier 108 in the high resistance state.

Figure 4:
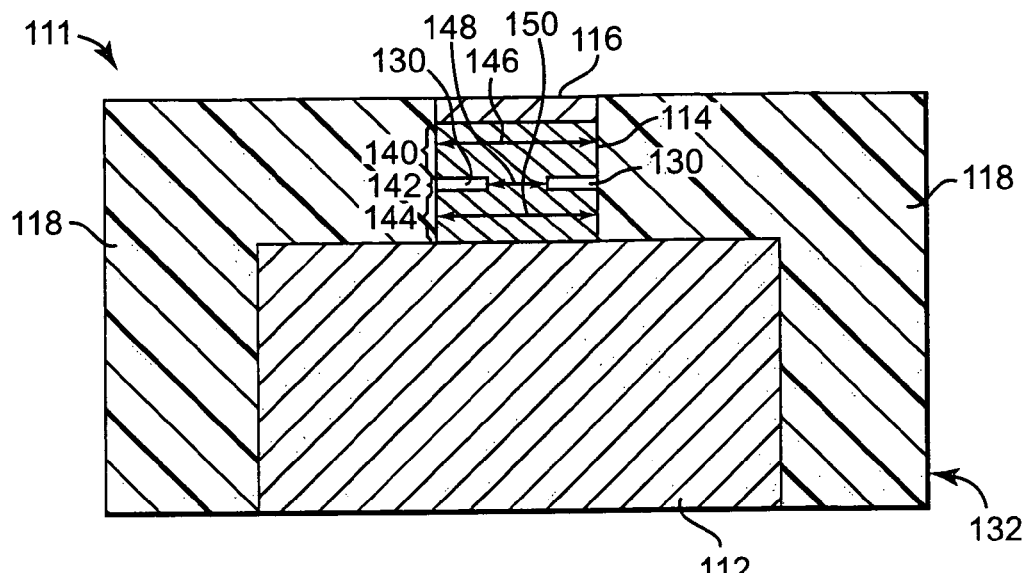
FIG. 4 illustrates a cross-sectional view of one embodiment of a phase-change memory cell, according to the present invention.

FIG. 4 illustrates a cross-sectional view of one embodiment of a phase-change memory cell 111, according to the present invention. Phase-change memory cell 111 includes first electrode 112, phase-change material 114, isolation material 130, second electrode 116, and insulator material 118. In one embodiment, isolation material 130 and insulation material 118 comprise the same material. Phase-change material 114 provides a storage location for storing one or more bits of data.

Phase-change material 114 includes a first portion 144 in contact with first electrode 112, a second portion 140 in contact with second electrode 116, and a third portion 142 between first portion 144 and second portion 140. First portion 144 of phase-change material 114 has a width 150, second portion 140 of phase-change material 114 has a width 146, and third portion 142 of phase-change material 114 has a width 148. Width 150 of first portion 144 and width 146 of second portion 140 are greater than width 148 of third portion 142. In one embodiment, width 148 of third portion 142 is approximately one third of width 150 of first portion 144 and width 146 of second portion 140. In another embodiment, width 148 of third portion 142 is approximately one half of width 150 of first portion 144 and width 146 of second portion 140. In other embodiments, other ratios of width 148 of third portion 142 to width 150 of first portion 144 and width 146 of second portion 140 are used, such as one fourth, two thirds, thee fourths, etc. In one embodiment, width 150 of first portion 144 is approximately equal to width 146 of second portion 140. In other embodiments, width 150 of first portion 144 is different than width 146 of second portion 140. In one embodiment, phase-change material 114 forms an "I" shape.

Phase-change material 114 may be made up of a variety of materials in accordance with the present invention. Generally, chalcogenide alloys that contain one or more elements from column VI of the periodic table are useful as such materials. In one embodiment, phase-change material 114 of memory cell 111 is made up of a chalcogenide compound material, such as GeSbTe, SbTe, or AgInSbTe. In another embodiment, the phase-change material can be chalcogen free such as GeSb, GaSb, or GeGaSb.

In one embodiment, isolation material 130 includes $SiO_2$, SiN, $Al_2O_2$, or other suitable isolation material. Isolation material 130 prevents current flow through low resistance shunt current paths, such as in incomplete melted area 122 as illustrated in FIG. 3 for an incompletely reset memory cell. Hence, isolation material layer 130 greatly increases the memory cell resistance and read signal in the reset state. Having the narrowest cross-section in the center (third portion) of phase-change material 114 provides the highest current density in a region farthest from first electrode 112 and second electrode 116. This narrow cross-section in the center (third portion) provides several advantages.

One advantage includes better heat retention due to lower thermal conductance of phase-change material 114 as compared with the metal contacts of first electrode 112 and second electrode 116. Another advantage is greater memory cell device reliability due to the region of highest temperature (the one that undergoes phase-change) not being adjacent to first electrode 112 or second electrode 116. The "I" shape of phase-change material 114 of memory cell 111 also enables a much lower reset current and power level to be used to obtain the same resistance as for a completely reset phase-change memory cell 110 (FIGS. 2 and 3). In one embodiment, the power consumption is reduced by more than 60%. Since the select transistor gate width used to provide the reset current is a limiting factor for memory cell size, the reduced reset current for memory cell 111 directly translates to a reduced phase-change memory cell size and thus chip size. The following FIGS. 5-11 illustrate embodiments of a process for fabricating phase-change memory cell 111.

Figure 5:
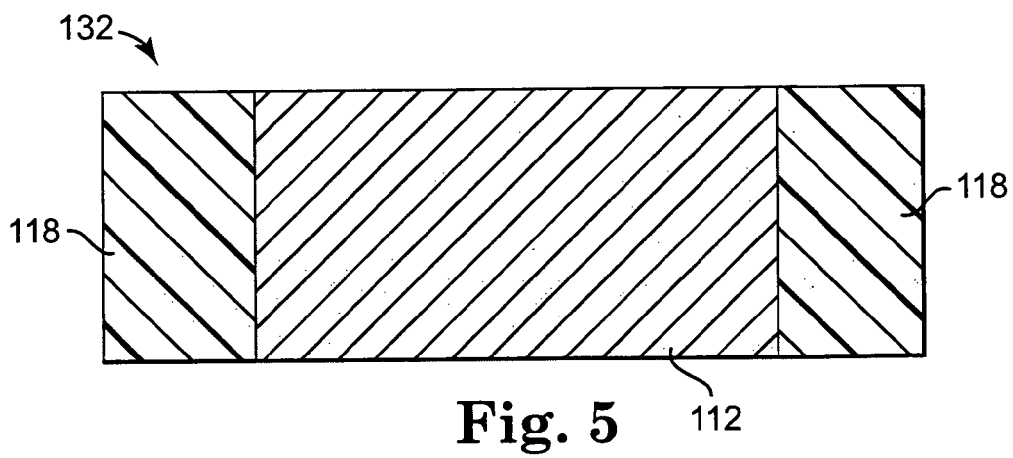
FIG. 5 illustrates a cross-sectional view of one embodiment of a preprocessed wafer.

FIG. 5 illustrates a cross-sectional view of one embodiment of a preprocessed wafer 132. Preprocessed wafer 132 includes insulation material 118, first electrode 112, and lower wafer layers (not shown). First electrode 112 is a tungsten plug, copper plug, or other suitable electrode. Insulation material 118 is $SiO_2$, fluorinated silica glass (FSG), or other suitable dielectric material.

Figure 6:
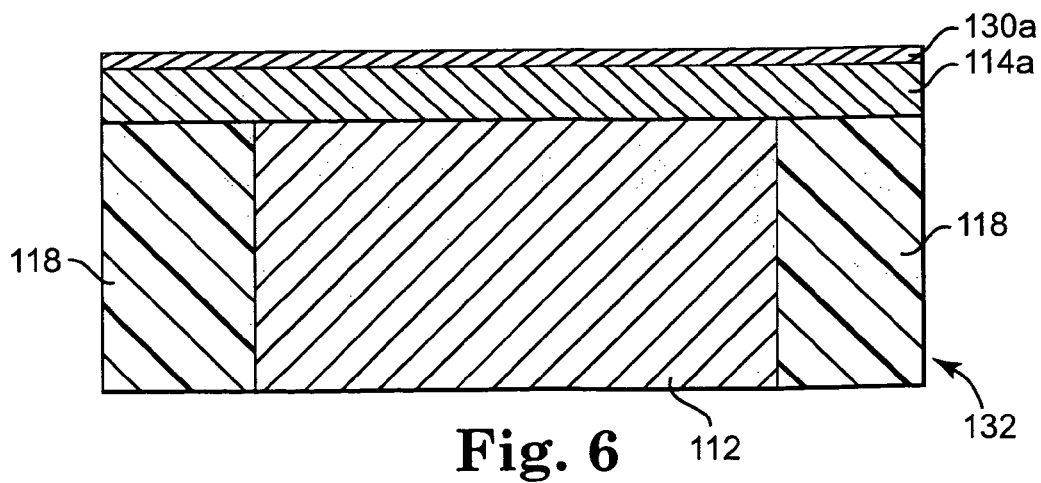
FIG. 6 illustrates a cross-sectional view of one embodiment of the preprocessed wafer, a first phase-change material layer, and an isolation material layer.

FIG. 6 illustrates a cross-sectional view of one embodiment of preprocessed wafer 132, a first phase-change material layer 114a, and an isolation material 130a. Phase-change material, such as a chalcogenic compound material or other suitable phase-change material, is deposited over preprocessed wafer 132 to provide first phase-change material layer 114a. First phase-change material layer 114a is deposited using chemical vapor deposition (CVD), atomic layer deposition (ALD), metal organic chemical vapor deposition (MOCVD), plasma vapor deposition (PVD), jet vapor deposition (JVP), or other suitable deposition technique.

Isolation material, such as $SiO_2$, SiN, $Al_2O_2$, or other suitable isolation material, is deposited over first phase-change material layer 114a to provide isolation material layer 130a. Isolation material layer 130a is deposited using CVD, ALD, MOCVD, PVD, JVP, or other suitable deposition technique.

Figure 7:
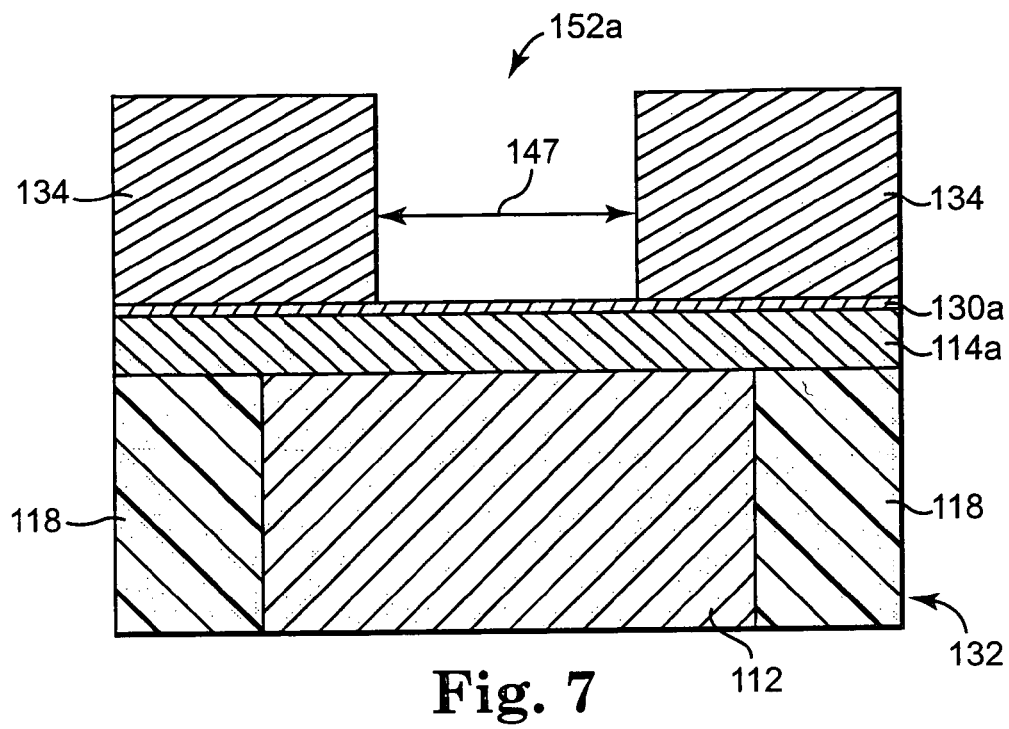
FIG. 7 illustrates a cross-sectional view of one embodiment of the preprocessed wafer, first phase-change material layer, isolation material layer, and a mask layer.

FIG. 7 illustrates a cross-sectional view of one embodiment of preprocessed wafer 132, first phase-change material layer 114a, isolation material layer 130a, and a mask layer 134. In one embodiment, mask layer 134 is provided by spin coating photoresist onto isolation material layer 130a and performing optical lithography to define mask layer 134 having an opening 152a. In one embodiment, opening 152a is a cylindrical opening above a single first electrode 112. In another embodiment, opening 152a is a trench opening that extends across one or an array of first electrodes 112. Opening 152a is defined by a width 147. In one embodiment, opening 152a in mask layer 134 is positioned approximately above the center of first electrode 112.

Figure 8:
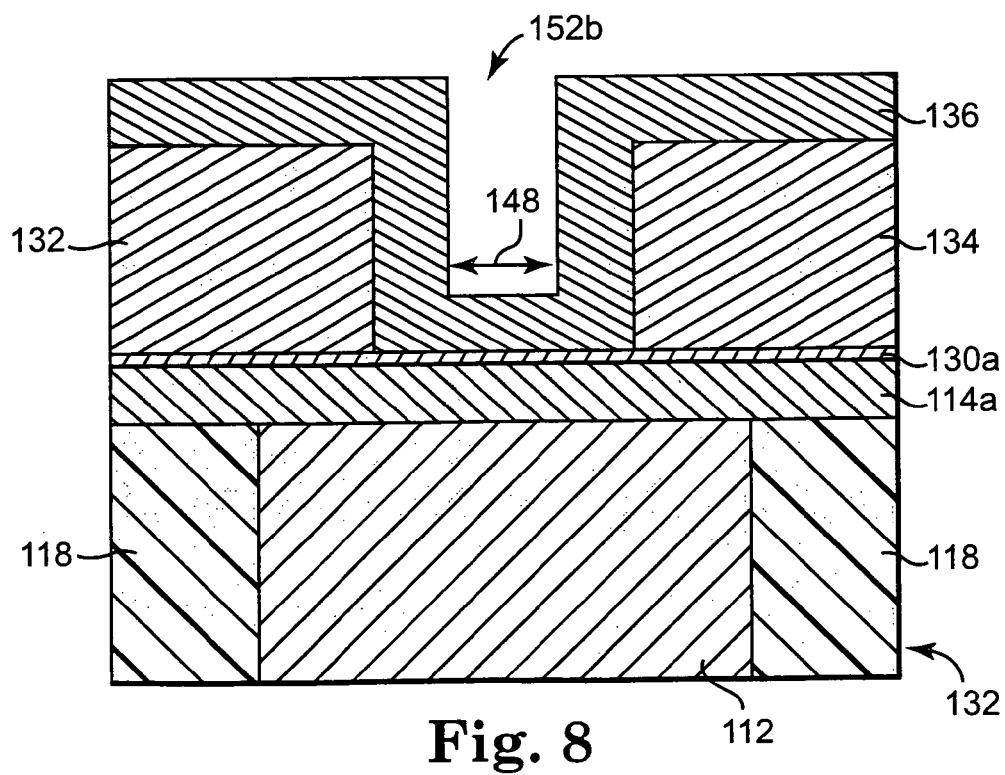
FIG. 8 illustrates a cross-sectional view of one embodiment of the preprocessed wafer, first phase-change material layer, isolation material layer, mask layer, and a spacer layer.

FIG. 8 illustrates a cross-sectional view of one embodiment of preprocessed wafer 132, first phase-change material layer 114a, isolation material layer 130a, mask layer 134, and a spacer layer 136. In one embodiment, a suitable spacer material is conformally deposited over exposed portions of mask layer 134 and isolation material layer 130a to provide spacer layer 136. In one embodiment, the spacer material is a polymer material, a carbon material, or other suitable spacer material. Spacer layer 136 is deposited using CVD, ALD, MOCVD, PVD, JVP, or other suitable deposition technique. Spacer layer 136 reduces width 147 of opening 152a to provide opening 152b defined by a sublithographic width 148. In other embodiments, any suitable method can be used to reduce width 147 of opening 152a to sublithographic width 148 of opening 152b.

Figure 9:
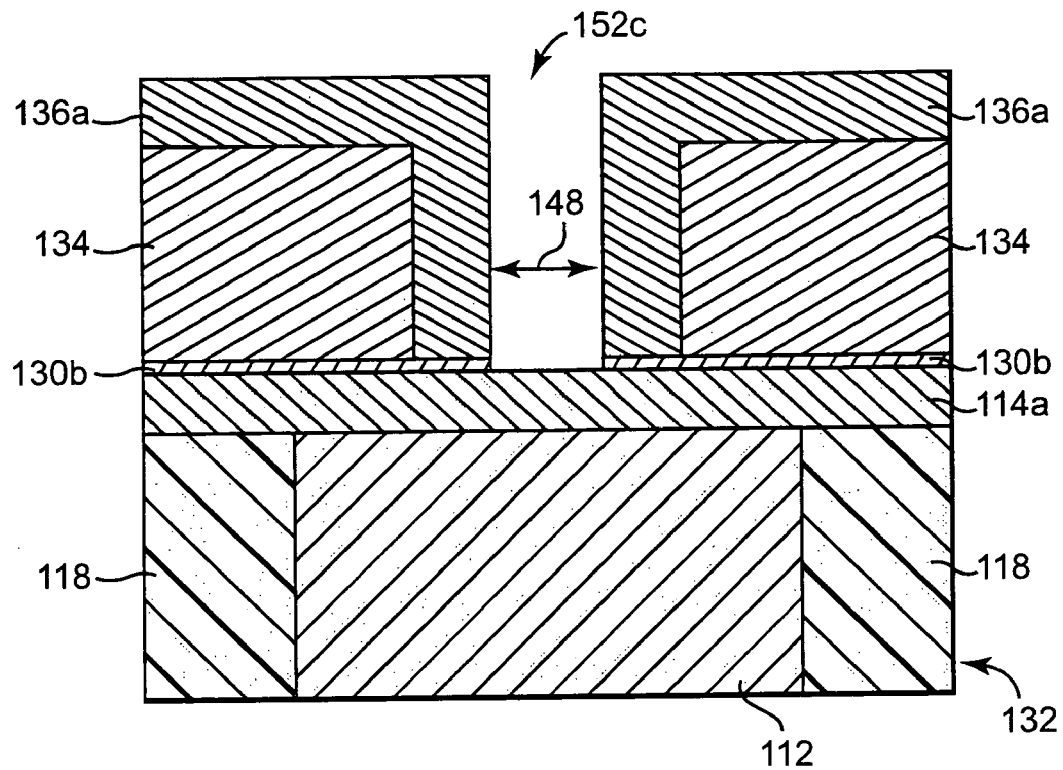
FIG. 9 illustrates a cross-sectional view of one embodiment of the preprocessed wafer, first phase-change material layer, isolation material layer, mask layer, and spacer layer after etching the spacer layer and the isolation material layer.

FIG. 9 illustrates a cross-sectional view of one embodiment of preprocessed wafer 132, first phase-change material layer 114a, isolation material layer 130b, mask layer 134, and spacer layer 136a after etching spacer layer 136 and isolation material layer 130a. The portion of spacer layer 136 at the bottom of opening 152b is etched using a plasma etch or other suitable etch. The defined opening through spacer layer 136a is transferred to isolation material layer 130a and isolation material layer 130a is etched using a dry etch or other suitable etch to provide isolation material layer 130b. The bottom of opening 152c exposes a portion of first phase-change material layer 114a defined by width 148.

Figure 10:
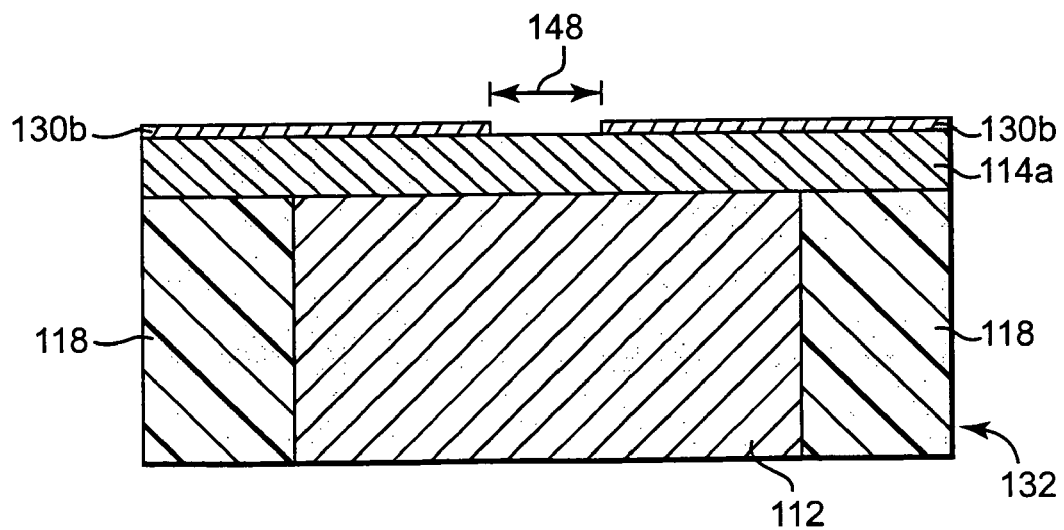
FIG. 10 illustrates a cross-sectional view of one embodiment of the preprocessed wafer, first phase-change material layer, and isolation material layer after removing the mask layer and the spacer layer.

FIG. 10 illustrates a cross-sectional view of one embodiment of preprocessed wafer 132, first phase-change material layer 114a, and isolation material layer 130b after removing mask layer 134 and spacer layer 136a. Spacer layer 136a and mask layer 134 are removed using a stripping process, selective dry etch process, or other suitable removal process.

Figure 11:
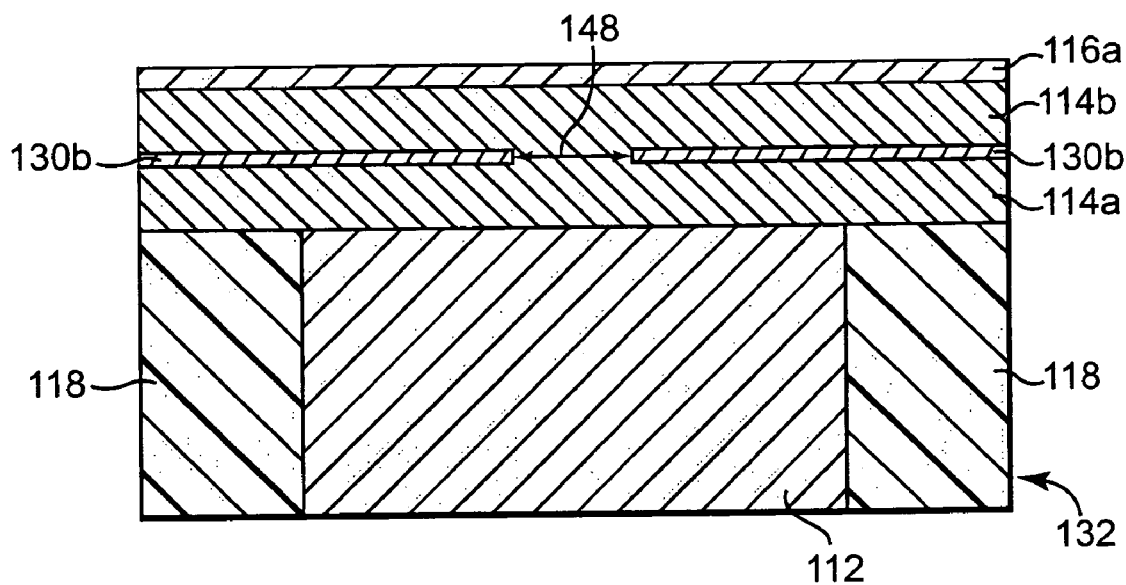
FIG. 11 illustrates a cross-sectional view of one embodiment of the preprocessed wafer, first phase-change material layer, isolation material layer, a second phase-change material layer, and an electrode material layer.

FIG. 11 illustrates a cross-sectional view of one embodiment of preprocessed wafer 132, first phase-change material layer 114a, isolation material layer 130b, a second phase-change material layer 114b, and an electrode material layer 116a. Phase-change material, such as a chalcogenic compound material or other suitable phase-change material, is deposited over exposed portions of isolation material layer 130b and first phase-change material layer 114a to provide second phase change material layer 114b. Second phase change material layer 114b is deposited using CVD, ALD, MOCVD, JVD, JVP, or other suitable deposition technique.

Electrode material, such as TiN, TaN, W, or other suitable electrode material, is deposited over second phase-change material layer 114b to provide electrode material layer 116a. Electrode material layer 116a, second phase-change material layer 114b, isolation material layer 130b, and first phase-change material layer 114a are etched to provide second electrode 116 and phase-change material 114 as illustrated in memory cell 111 of FIG. 4. In one embodiment, second electrode 116 provides a landing pad for the next level metallization plug.

Insulation material 118 is deposited around second electrode 116, phase-change material 114, and isolation material 130. In one embodiment, insulation material 118 and second electrode 116 are planarized using chemical mechanical polishing (CMP) or other suitable planarizing technique to provide phase-change memory cell 111 as illustrated in FIG. 4.

Figure 12:
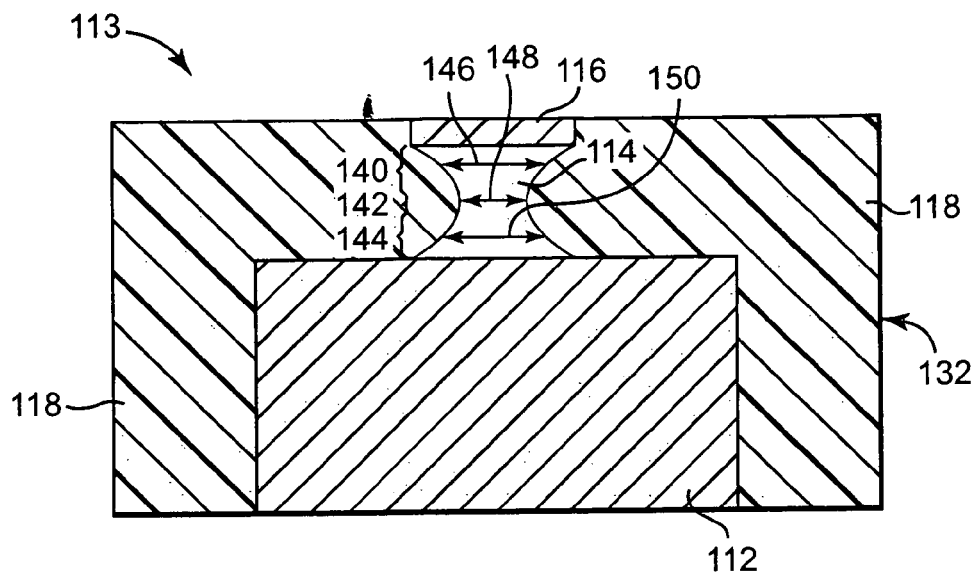
FIG. 12 illustrates a cross-sectional view of another embodiment of a phase-change memory cell, according to the present invention.

FIG. 12 illustrates a cross-sectional view of another embodiment of a phase-change memory cell 113. Phase-change memory cell 113 includes first electrode 112, phase-change material 114, second electrode 116, and insulator material 118. Phase-change material 114 provides a storage location for storing one bit or several bits of data. Phase-change material 114 is laterally completely enclosed by insulation material 118, which defines the current path and hence the location of the phase-change region in phase-change material 114.

Phase-change material 114 includes a first portion 144 in contact with first electrode 112, a second portion 140 in contact with second electrode 116, and a third portion 142 between first portion 144 and second portion 140. First portion 144 of phase-change material 114 has a width 150, second portion 140 of phase-change material 114 has a width 146, and third portion 142 of phase-change material 114 has a width 148. Width 150 of first portion 144 and width 146 of second portion 140 are greater than width 148 of third portion 142. In one embodiment, a maximum width of third portion 142 is less than a minimum width of first portion 144 and a minimum width of second portion 140. In another embodiment, a minimum width of third portion 142 is less than a minimum width of first portion 144 and a minimum width of second portion 140. In another embodiment, a maximum width of third portion 142 is less than a maximum width of first portion 144 and a maximum width of second portion 140. In another embodiment, a minimum width of third portion 142 is less than a maximum width of first portion 144 and a maximum width of second portion 140.

In one embodiment, width 150 of first portion 144 is approximately equal to width 146 of second portion 140. In other embodiments, width 150 of first portion 144 is different than width 146 of second portion 140. In one embodiment, phase-change material 114 forms an hourglass shape. The hourglass shape of phase-change material 114 provides similar characteristics as the "I" shaped phase-change material 114 of memory cell 111 (FIG. 4). The following FIGS. 13-16 illustrate embodiments of a process for fabricating phase-change memory cell 113.

Figure 13:
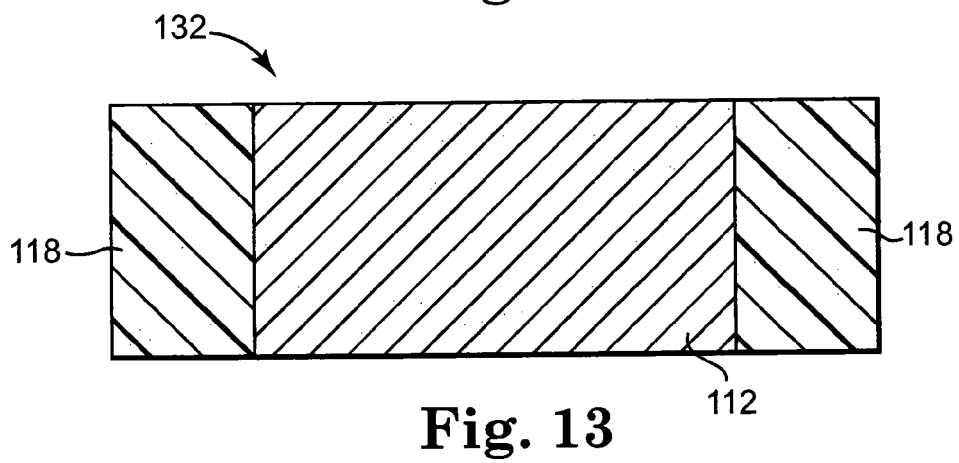
FIG. 13 illustrates a cross-sectional view of one embodiment of a preprocessed wafer.

FIG. 13 illustrates a cross-sectional view of one embodiment of a preprocessed wafer 132. Preprocessed wafer 132 includes insulation material 118, first electrode 112, and lower wafer layers (not shown). First electrode 112 is a tungsten plug, copper plug, or other suitable electrode. Insulation material 118 is $SiO_2$, FSG, or other suitable dielectric material.

Figure 14:
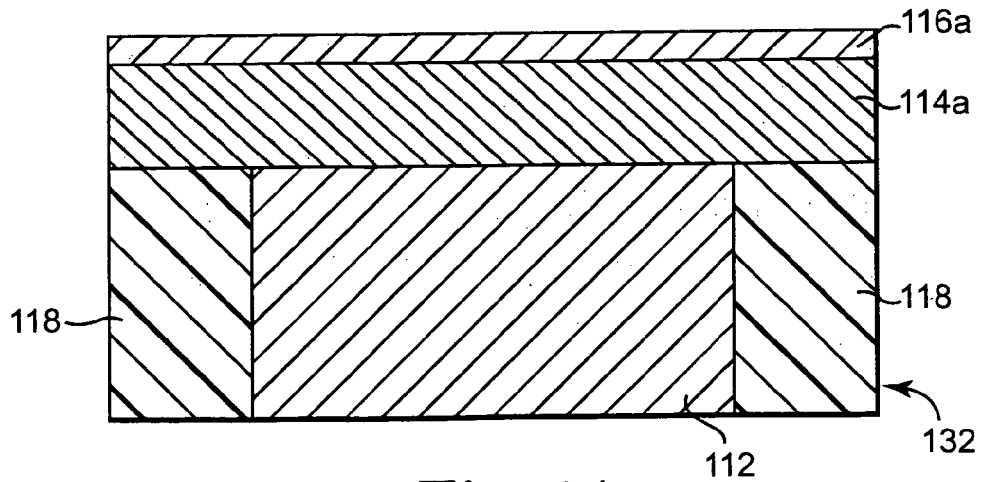
FIG. 14 illustrates a cross-sectional view of one embodiment of the preprocessed wafer, a phase-change material layer, and an electrode material layer.

FIG. 14 illustrates a cross-sectional view of one embodiment of preprocessed wafer 132, a phase-change material layer 114a, and an electrode material layer 116a. Phase-change material, such as a chalcogenic compound material or other suitable phase-change material, is deposited over preprocessed wafer 132 to provide phase-change material layer 114a. Phase-change material layer 114a is deposited using CVD, ALD, MOCVD, PVD, JVP, or other suitable deposition technique.

An electrode material, such as TiN, TaN, W, or other suitable electrode material, is deposited over phase-change material layer 114a to provide electrode material layer 116a. Electrode material layer 116a is deposited using CVD, ALD, MOCVD, PVD, JVP, or other suitable deposition technique.

Figure 15:
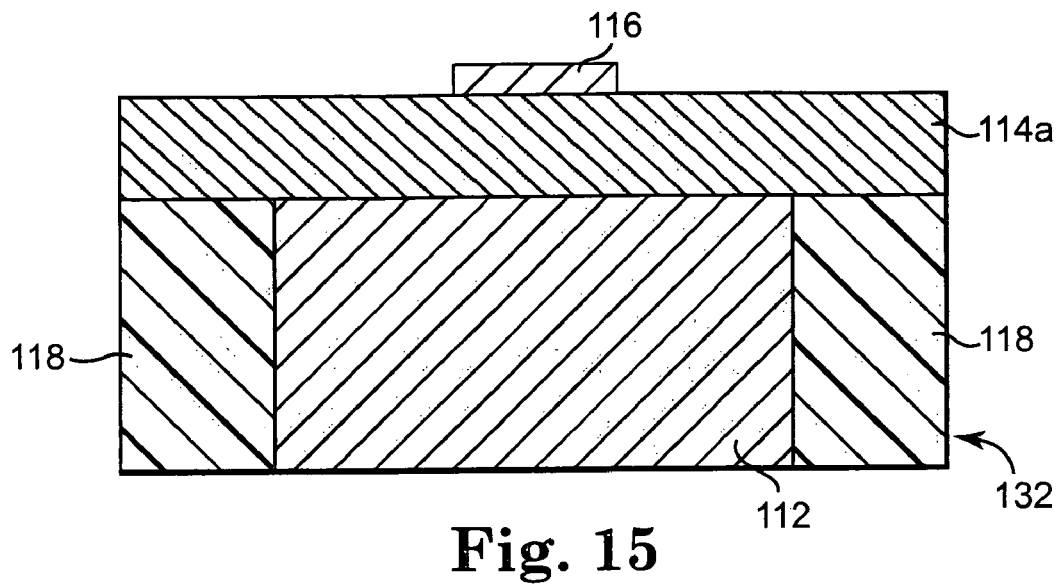
FIG. 15 illustrates a cross-sectional view of one embodiment of the preprocessed wafer, phase change material layer, and electrode material layer after etching the electrode material layer.

FIG. 15 illustrates a cross-sectional view of one embodiment of preprocessed wafer 132, phase-change material layer 114a, and second electrode 116 after etching electrode material layer 116a. In one embodiment, electrode material layer 116a is etched to form a cylindrical second electrode 116. In another embodiment, electrode material layer 116a is etched to form a second electrode 116 column that extends across one or more first electrodes 112. Electrode material layer 116a is etched using a dry etch or other suitable etching process to provide second electrode 116. In one embodiment, second electrode 116 is positioned approximately above the center of first electrode 112. In one embodiment, second electrode 116 provides a landing pad for the next level metallization plug.

Figure 16:
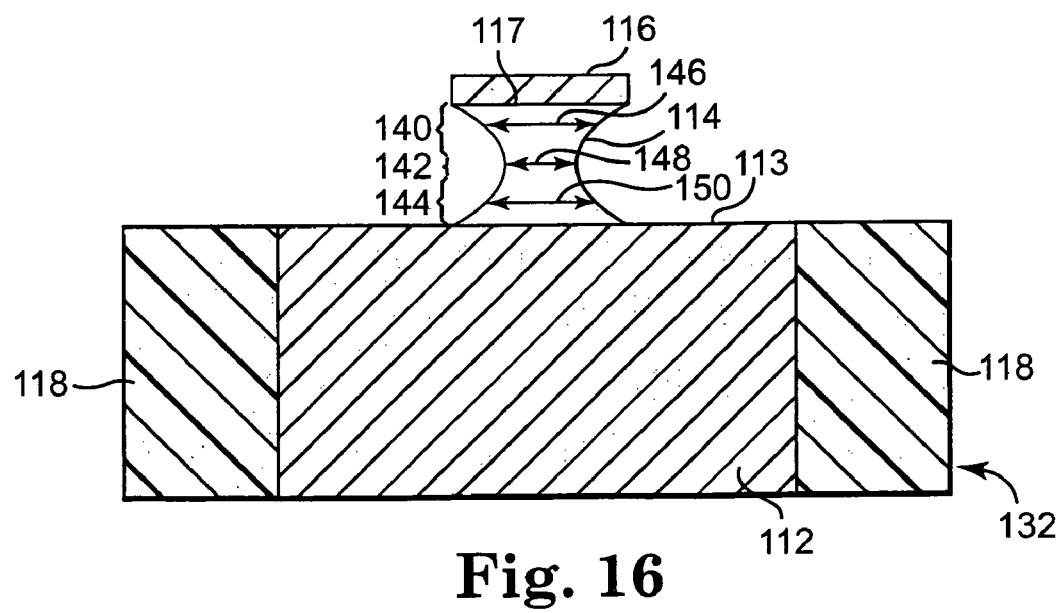
FIG. 16 illustrates a cross-sectional view of one embodiment of the preprocessed wafer, phase-change material layer, and second electrode material layer after etching the phase-change material layer.

FIG. 16 illustrates a cross-sectional view of one embodiment of preprocessed wafer 132, phase-change material 114, and second electrode 116 after etching phase-change material layer 114a. An undercutting etch is used to undercut phase-change material layer 114a under second electrode 116. The etching process used depends on the type of phase-change material 114. For example, in one embodiment, a chlorine and/or argon containing plasma etch can be used to etch a GeSbTe phase-change material layer 114a. Phase-change material layer 114a is etched to form an hourglass shaped storage location including first portion 144, second portion 140, and third portion 140.

Phase-change material 114a is etched to provide first portion 144 having width 150, second portion 140 having width 146, and third portion 142 having width 148. First portion 144 contacts first electrode 112 and second portion 140 contacts second electrode 116. In one embodiment, first portion 144 contacts all of top surface 113 of first electrode 112 or a portion of top surface 113 of first electrode 112. In one embodiment, second portion 140 contacts all of bottom surface 117 of second electrode 116 or a portion of bottom surface 117 of second electrode 116. Width 148 of third portion 142 is less than width 150 of first portion 144 and width 146 of second portion 140. In one embodiment, width 150 of first portion 144 is approximately equal to width 146 of second portion 140. In another embodiment, width 150 of first portion 144 is different than width 156 of second portion 140.

Next, insulation material 118 is deposited around second electrode 116 and phase-change material 114. In one embodiment, insulation material 118 and second electrode 116 are planarized using chemical mechanical polishing (CMP) or other suitable planarizing technique to provide phase-change memory cell 113 as illustrated in FIG. 12.

Figure 17:
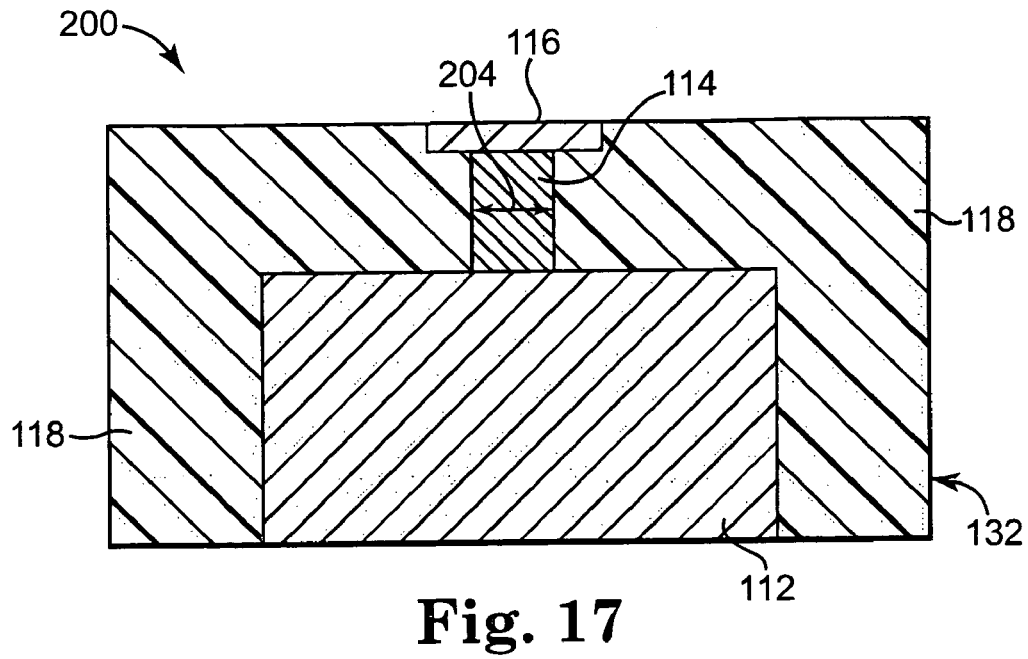
FIG. 17 illustrates a cross-sectional view of another embodiment of a phase-change memory cell, according to the present invention.

FIG. 17 illustrates a cross-sectional view of another embodiment of a phase-change memory cell 200. Phase-change memory cell 200 includes first electrode 112, phase-change material 114, second electrode 116, and insulator material 118. Phase-change material 114 provides a storage location for storing one bit or several bits of data. Phase-change material 114 is laterally completely enclosed by insulation material 118, which defines the current path and hence the location of the phase-change region in phase-change material 114. Phase-change material 114 is defined by a sublithographic width 204. Sublithographic width 204 is obtained by using an undercutting etching process to etch phase-change material 114 similar to the process previously described and illustrated with respect to FIGS. 12-16 for fabricating phase-change memory cell 113.

Figure 18:
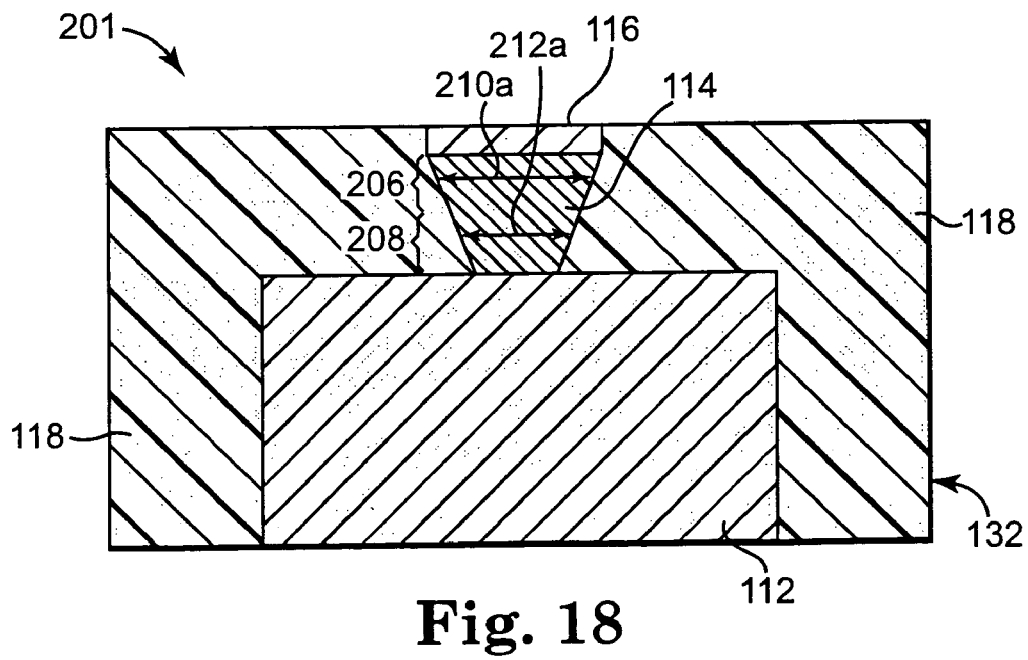
FIG. 18 illustrates a cross-sectional view of another embodiment of a phase-change memory cell, according to the present invention.

FIG. 18 illustrates a cross-sectional view of another embodiment of a phase-change memory cell 201. Phase-change memory cell 201 includes first electrode 112, phase-change material 114, second electrode 116, and insulator material 118. Phase-change material 114 provides a storage location for storing one bit or several bits of data. Phase-change material 114 is laterally completely enclosed by insulation material 118, which defines the current path and hence the location of the phase-change region in phase-change material 114.

Phase-change material 114 includes a first portion 208 in contact with first electrode 112 and a second portion 206 in contact with second electrode 116. First portion 208 of phase-change material 114 has a width 212a, and second portion 206 of phase-change material 114 has a width 210a. Width 212a of first portion 208 is less than width 210a of second portion 206. In one embodiment, a maximum width of first portion 208 is less than a minimum width of second portion 206. In another embodiment, a minimum width of first portion 208 is less than a minimum width of second portion 206. In another embodiment, a maximum width of first portion 208 is less than a maximum width of first portion 206. In another embodiment, the width of phase-change material 114 varies from a minimum width to a maximum width between first portion 208 in contact with first electrode 112 and second portion 206 in contact with second electrode 116. The shape of phase-change material 114 is obtained by using an undercutting etching process similar to the process previously described and illustrated with respect to FIGS. 12-16 for fabricating phase-change memory cell 113.

Figure 19:
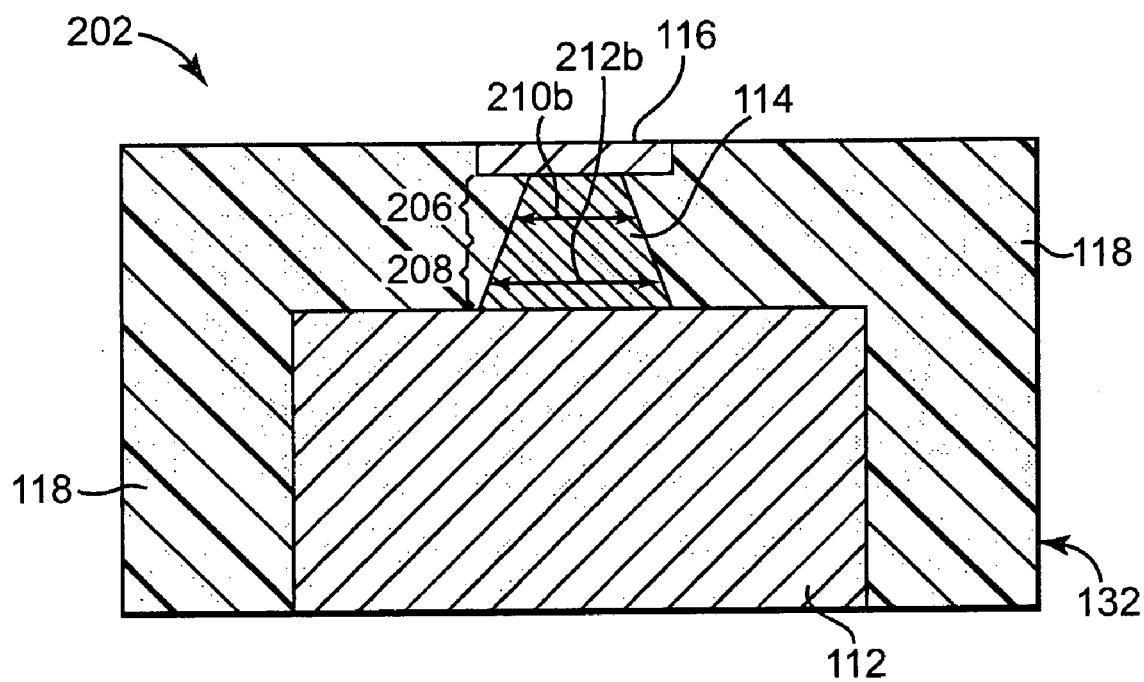
FIG. 19 illustrates a cross-sectional view of another embodiment of a phase-change memory cell, according to the present invention.

FIG. 19 illustrates a cross-sectional view of another embodiment of a phase-change memory cell 202. Phase-change memory cell 202 includes first electrode 112, phase-change material 114, second electrode 116, and insulator material 118. Phase-change material 114 provides a storage location for storing one bit or several bits of data. Phase-change material 114 is laterally completely enclosed by insulation material 118, which defines the current path and hence the location of the phase-change region in phase-change material 114.

Phase-change material 114 includes a first portion 208 in contact with first electrode 112 and a second portion 206 in contact with second electrode 116. First portion 208 of phase-change material 114 has a width 212b, and second portion 206 of phase-change material 114 has a width 210b. Width 212b of first portion 208 is greater than width 210b of second portion 206. In one embodiment, a minimum width of first portion 208 is greater than a maximum width of second portion 206. In another embodiment, a minimum width of first portion 208 is greater than a minimum width of second portion 206. In another embodiment, a maximum width of first portion 208 is greater than a maximum width of second portion 206. In another embodiment, the width of phase-change material 114 varies from a maximum width to a minimum width between first portion 208 in contact with first electrode 112 and second portion 206 in contact with second electrode 116. The shape of phase-change material 114 is obtained by using an undercutting etching process' similar to the process previously described and illustrated with respect to FIGS. 12-16 for fabricating phase-change memory cell 113.

Embodiments of the present invention provide phase-change memory cells having storage locations of sublithographic dimensions by using an undercutting etching process or other suitable process. In one embodiment, the phase-change material of the memory cells have a shape in which the portions of the phase-change material that contact the electrodes are wider or have a larger cross-sectional area than the central portion of the phase-change material. In another embodiment, the phase-change material of the memory cells have a shape in which one portion of the phase-change material that contacts one electrode is wider or has a larger cross-section area than another portion of the phase-change material that contacts another electrode. The shape of the phase-change material prevents low resistance shunt current paths through the phase-change material with the phase-change material not fully reset. The shape of the phase-change material enables the use of less current and power than a typical phase-change memory cell resulting in a smaller memory cell size.

What is claimed is:

1. A memory cell comprising:
   a first electrode having a top surface;
   a second electrode having a bottom surface parallel to the top surface of the first electrode;
   phase-change material comprising a first portion contacting the top surface of the first electrode, a second portion contacting the bottom surface of the second electrode, and a third portion between the first portion and the second portion; and
   a dielectric material laterally surrounding and directly contacting the first portion, the second portion, and the third portion,
   wherein a width of the third portion is less than a width of the first portion and a width of the second portion, the first, second, and third portion each comprising a same chalcogen free material compound.

2. The memory cell of claim 1, wherein the width of the first portion is approximately equal to the width of the second portion.

3. The memory cell of claim 1, wherein the phase-change material forms an "I" shape.

4. A memory cell comprising:
   a first electrode having a top surface;
   a second electrode having a bottom surface parallel to the top surface of the first electrode; and
   phase-change material comprising a first portion contacting the top surface of the first electrode, a second portion contacting the bottom surface of the second electrode, and a third portion between the first portion and the second portion,
   wherein a width of the third portion is less than a width of the first portion and a width of the second portion, the first, second, and third portion each comprising a same chalcogen free material compound,
   wherein the phase-change material forms an hourglass shape such that a sidewall of the phase-change material extending between the first electrode and the second electrode is curved.

5. The memory cell of claim 4, wherein the width of the first portion is approximately equal to the width of the second portion.

6. A memory device comprising:
   a write pulse generator for generating a write pulse signal;
   a sense amplifier for sensing a read signal;
   a distribution circuit; and
   a plurality of phase-change memory cells each comprising phase-change material, each memory cell capable of defining at least a first state and a second state,
   wherein the phase-change material for each memory cell includes a first portion contacting a top surface of a first electrode, a second portion contacting a bottom surface of a second electrode, and a third portion between the first portion and the second portion, the top surface of the first electrode parallel to the bottom surface of the second electrode,
   wherein a minimum width of the third portion is less than one half of a maximum first width of the first portion and a maximum second width of the second portion, the first, second, and third portion each comprising a same chalcogen free material compound, and wherein a dielectric material laterally surrounds and directly contacts the first portion, the second portion, and the third portion.

7. The memory device of claim 6, wherein a maximum width of the third portion is less than a minimum first width of the first portion and a minimum second width of the second portion.

8. The memory device of claim 6, wherein a maximum width of the third portion is less than the maximum first width of the first portion and the maximum second width of the second portion.

9. The memory device of claim 6, wherein the minimum width of the third portion is less than a minimum first width of the first portion and a minimum second width of the second portion.

10. The memory device of claim 6, wherein the maximum first width of the first portion is approximately equal to the maximum second width of the second portion.

11. The memory device of claim 6, wherein the phase-change material for each memory cell forms an "I" shape.

12. A memory device comprising:
a write pulse generator for generating a write pulse signal;
a sense amplifier for sensing a read signal;
a distribution circuit; and
a plurality of phase-change memory cells each comprising phase-change material, each memory cell capable of defining at least a first state and a second state,
wherein the phase-change material for each memory cell includes a first portion contacting a top surface of a first electrode, a second portion contacting a bottom surface of a second electrode, and a third portion between the first portion and the second portion, the top surface of the first electrode parallel to the bottom surface of the second electrode,
wherein a minimum width of the third portion is less than one half of a maximum first width of the first portion and a maximum second width of the second portion, the first, second, and third portion each comprising a same chalcogen free material compound, and
wherein the phase-change material for each memory cell forms an hourglass shape such that a sidewall of the phase-change material extending between the first electrode and the second electrode is curved.

13. The memory device of claim 12, wherein a maximum width of the third portion is less than a minimum first width of the first portion and a minimum second width of the second portion.

14. The memory device of claim 12, wherein a maximum width of the third portion is less than the maximum first width of the first portion and the maximum second width of the second portion.

15. The memory device of claim 12, wherein the minimum width of the third portion is less than a minimum first width of the first portion and a minimum second width of the second portion.

16. The memory device of claim 12, wherein the maximum first width of the first portion is approximately equal to the maximum second width of the second portion.

17. An integrated circuit including a memory cell comprising:
a first electrode having a top surface;
a second electrode having a bottom surface parallel to the top surface of the first electrode;
resistance changing material comprising a first portion contacting the top surface of the first electrode, a second portion contacting the bottom surface of the second electrode, and a third portion between the first portion and the second portion; and
a dielectric material laterally surrounding and directly contacting the first portion, the second portion, and the third portion,
wherein a width of the third portion is less than one half of a width of the first portion and a width of the second portion, the first, second, and third portion each comprising a same chalcogen free material compound.

18. The integrated circuit of claim 17, wherein the width of the first portion is approximately equal to the width of the second portion.

19. The integrated circuit of claim 17, wherein the resistance changing material forms an "I" shape.

20. The integrated circuit of claim 17, wherein the resistance changing material comprises phase-change material.

21. An integrated circuit including a memory cell comprising:
a first electrode having a top surface;
a second electrode having a bottom surface parallel to the top surface of the first electrode; and
resistance changing material comprising a first portion contacting the top surface of the first electrode, a second portion contacting the bottom surface of the second electrode, and a third portion between the first portion and the second portion,
wherein a width of the third portion is less than one half of a width of the first portion and a width of the second portion, the first, second, and third portion each comprising a same chalcogen free material compound, and
wherein the resistance changing material forms an hourglass shape such that a sidewall of the resistance changing material extending between the first electrode and the second electrode is curved.

22. The integrated circuit of claim 21, wherein the width of the first portion is approximately equal to the width of the second portion.

23. The integrated circuit of claim 21, wherein the resistance changing material comprises phase-change material.

* * * * *